United States Patent [19]

Grote et al.

[11] Patent Number: 4,728,930
[45] Date of Patent: Mar. 1, 1988

[54] PARALLEL-TO-SERIAL-DATA INTERFACE-ADAPTOR

[75] Inventors: Kevin J. Grote; Craig A. Freed, both of Waldorf, Md.

[73] Assignee: The United States of America as represented by the Secretary of the Navy, Washington, D.C.

[21] Appl. No.: 67,856

[22] Filed: Jun. 30, 1987

[51] Int. Cl.[4] .......................................... H03M 9/00
[52] U.S. Cl. ............................................ 340/347 DD
[58] Field of Search ............... 340/347 DD; 364/200, 364/900

[56] References Cited

U.S. PATENT DOCUMENTS

4,481,514 11/1984 Beukers et al. ................. 340/870.1
4,549,177 10/1985 Warburton ..................... 340/825.57
4,617,624 10/1986 Goodman ............................ 364/200

Primary Examiner—William M. Shoop, Jr.
Assistant Examiner—Richard K. Blum
Attorney, Agent, or Firm—Elmer E. Goshorn; William C. Townsend

[57] ABSTRACT

An improved parallel-to-serial-data interface-adaptor that is generally made up of master and slave data processors having master and slave microprocessors, master and slave multibit latches, and separate pairs of read only and random access memories for both the master and slave processors. A data input/output (I/O) bus and an address bus are provided for interconnecting various elements of either the master or slave processors. An interface advantageously interconnects the slave data I/O bus with the master data I/O bus. The master microprocessor advantageously functions to selectively process the master parallel data input when received so that it is compatible with a serial data processor when the selectively processed parallel data input is converted to serial format by a parallel-to-serial-data converter. The master processor further functions by way of the interface to convert a slave parallel data input previously processed by the slave processor to a serial form when the master processor is not busy in processing a parallel data input. The improved master/slave adaptor preferably handles two separate 32-bit parallel data inputs with either input being selectively processed and readily converted by the improved adaptor to a 32-bit serial format that is compatible with a serial data processor.

12 Claims, 5 Drawing Figures

PARALLEL-TO-SERIAL-DATA INTERFACE-ADAPTOR

This invention relates to a parallel-to-serial-data interface-adaptor; and, more particularly, it concerns an improved parallel-to-serial-data interface-adaptor for handling at least two separate parallel data inputs, selectively processing either data input and then converting either processed data input into a serial data output that is compatible with a serial data processor.

BACKGROUND OF THE INVENTION

Various types of data adaptors have been designed in the past primarily for the purpose of rendering one data processing network to be compatible with another data processing network. For example, U.S. Pat. No. 4,549,177 to A. W. Warburton discloses a precision fathometer interface adaptor that enables computerized oceanographic surveys of both shallow and deep water depths to be conducted at the same time from a surface vessel. The adaptor is generally made up of a series of five 4-bit flip-flop latch devices, a series of four quad-two multiplexers, a series of five dual data bus controllers and a 16-bit parallel byte computer. A gate control and mode selection device is interconnected to the latch devices, multiplexers and controllers for controlling the admission of 16-bit and 20-bit parallel data sensor sources and for converting the 20-bit parallel data sensor source to 16-bit parallel data sensor source all for ultimate processing by the computer. U.S. Pat. No. 4,481,514 to J. M. Beukers et al relates to a microprocessor based radiosonde or a balloon launchable high altitude, round trackable and gravity descending atmospheric parameter measuring device. The atmospheric measuring device is generally made up of a multiplexer for receiving atmospheric parameter-sensor inputs, an analog-to-digital converter, a miroprocessor, a radio transmitter and an ascent/descent control switch for the microprocessor. In response to the control switch, the microprocessor controls the multiplexer as to when the multiplexer can transmit sensed atmospheric parameters for processing and transmission in a serial digitized data stream to a ground station. U.S. Pat. No. 4,617,624 to J. B. Goodman concerns a peripheral memory apparatus for a central processor unit (CPU) where the apparatus has more than one operative mode configuration. The apparatus is generally made up of a CPU information bus, a pair of data input/output (I/O) buffers, and address buffer, an address select logic device, a controller, a pair of memory banks and a data source arrangement. The data source arrangement is operatively associated with the controller, the memory banks and the data I/O buffers. Depending on the operation of an address-logic controller, a memory bank is addressed directly or indirectly for removal of data to the CPU bus.

However, none of the aforediscussed references were remotely concerned with an improved parallel-to-serial-data interface-adaptor that is readily and preferably connectable to at least two parallel 32-bit data inputs. Moreover, the adaptor is operable to selectively process either one of the two parallel data inputs when received and then is further operable to convert any processed data input into a serial data stream as an output to a serial data processor and the like for subsequent processing. Once the adaptor is initialized and by reason of the adaptor being of master/slave configuration, it can handle separate parallel data inputs in selective fashion without requiring manual or operator assistance in processing either parallel input to a predetermined configuration and then converting any processed data input to a serial format output that is compatible with a serial data processor.

SUMMARY OF THE INVENTION

An object of the invention is to provide an improved parallel-to-serial-data interface-adaptor which is of compact construction that can be readily programmed to selectively process and convert two parallel data inputs into a serial data output that is compatible with a serial data processor.

Another object of the present invention is to provide an improved parallel-to-serial-data interface-adaptor which, when it is initialized for operation, is always ready to receive, process and convert a data input to a serial formatted output.

Still another object of the invention is to provide an improved parallel-to-serial-data interface-adaptor for selectively processing each parallel data input such are reconfiguring and reencoding various bits of the input so that when the input is converted to serial form it is fully compatible with a subsequent data processor and the like.

In summary, an improved parallel-to-serial-data inteface-adaptor is generally made up of master and slave processors and interface means for interconnecting the processors. The master and slave processors are each generally comprises of a microprocessor, a read only memory (ROM), a radom access memory (RAM), a memory selector, and a flip-flop. An array of four 8-bit parallel-data-input latch devices is connected to either processor. Each microprocessor is provided with data input/output (I/O) 8-bit bus drivers and a pair of 8-bit address bus drivers. A data input/output (I/O) bus for either processor is interconnected to the data I/O bus driver, the arrayed latch devices, the interface means, the RAM and the ROM. The adaptor is provided with a parallel-to-serial-data converter that is connected to the master processor and also includes a serial data stream output. A first encoder is provided for either processor and is operatively associated with the microprocessor thereof.

Each master and slave processor is provided with a latch selector. A second encoder of the master or slave processor has its output connected to its associated master or slave interface of the master/slave interface means. Further, the second encoder of the master processor also has output means connected to the parallel-to-serial-data converter means. A 16-bit address bus for either processor is appropriately connected to the pair of address bus drivers and is also selectively connected to the latch selector, the interface means, the second encoder, the RAM, the ROM and the memory selector. The address bus of the master processor is also connected to the parallel-to-serial-data converter.

The first encoder of either processor has a pair of leads connected to a data I/O control bus that is connected to the interface means. The data I/O control bus of the master processor is also connected to the parallel-to-serial-data converter. A memory read only control lead is also connected to the first encoder of either processor and to both the RAM and ROM thereof. Similarly, a memory write only control lead of the first encoder of either processor is connected to the RAM only thereof. An input/output (I/O) control lead of the microprocessor of either processor is parallel connected to its associated first and second encoders, the memory selector and the latch selector. Appropriate power supply means for energizing any of the elements of the master/slave processors, the interface means and the parallel-to-serial-data converter are not shown for the sake of simplicity.

The read control lead of the microprocessor of either processor is also parallel connected to the NAND gate. An interrupt lead of the microprocessor of either processor is also connected to the first NAND gate. The output of the first NAND gate is connected to the input of a second NAND gate. A positive bias of a preselected value is also connected to another input of the second NAND gate. The output of the second NAND gate of either processor is connected to its associated data bus driver thereof. By reason of the NAND gates together with their particular arrangement, the data bus driver of a processor is precisely and quicxkly controlled for either receiving a data input to its associated microprocessor or for transmitting a data output therefrom to a preselected addressed component of the adaptor during its use.

In an operative embodiment of the improved adaptor, both processors thereof are initialized and their external interrupts are enabled. The master microprocessor via its data I/O bus is awaiting a parallel data input at either the arrayed latch devices associated therewith or the interface means. The slave microprocessor via its data I/O bus is awaiting a parallel data input via the arrayed latch devices associated therewith.

Assuming a 32-bit parallel-data input is received by the arrayed latch device of the master processor, a command signal is also received by the flip-flop to actuate same and is also received by the master microprocessor to indicate that a parallel data input has been received by the master processor. The master microprocessor via both of its address bus drivers transmits separate series of binary encoded signals to both the memory selector and the ROM so as to read selected stored signals in the ROM for transfer over the master data I/O bus to the microprocessor. At the same time, the master microprocessor encoder by way of its read and interrupt control leads connected to the first NAND gate controls the operation of both NAND gates and in turn the parallel-data bus driver means so that it will receive a data input. Then, when the master microprocessor receives the ROM stored signals, the master microprocessor via the first address driver transmits a series of encoded signals over certain address bus portions for actuating the latch selector to extract and transfer 8-bits of the parallel data input latched in the first latch device of the arrayed four latch devices of the master processor to the data I/O bus, the data bus driver and then to the master microprocessor. Prior to the latch selector being addressed it is enabled by the I/O control lead of the master microprocessor. With the first 8-bit parallel data stored in the master microprocessor, the master microprocessor advantageously further functions in conjunction with the address bus drivers, the address bus, the ROM, the latch and memory selectors, the data I/O bus and the data bus driver to progressively remove and transfer in sequence fashion the second, third and fourth 8-bits of parallel data input from the second, third and fourth latch devices of the array of four latch devices to the master microprocessor. Further, the data I/O control bus of the master processor in being connected to the interface means prevents transmission of a processed parallel data input by the slave processor to the master processor when the master microprocessor is busy receiving a data input from the latched array device associated with the master processor.

The master microprocessor then transmits another series of signals via both address bus drivers, the address bus to the memory selector and the ROM so as to enable the ROM to be actuated and read stored signals from the ROM when a signal is transmitted via the memory read only control lead from the first encoder to the ROM. The read signals are transferred from the ROM to the microprocessor via the data bus and the data bus driver. These ROM signals cause selective processing by the microprocessor of the 32-bit parallel data temporarily stored in the master microprocessor registry. Such processing can include reconfiguring, reencoding or any combination thereof of various preselected bit locations of the parallel data input.

Then the master microprocessor via both address bus drivers and the address bus addresses the memory selector and the ROM so as to enable the ROM to be actuated to read a third series of stored signals and transfer the read signals from the ROM via the data I/O bus to the microprocessor when the first encoder transmits a signal via its memory read only control lead to the ROM. When these stored ROM signals are received the microprocessor functions to transfer the processed and temporarily stored 32-bit parallel data in 8-bit parallel data word fashion from the microprocessor via the data bus driver and the data I/O bus to the RAM and the parallel-to-serial-data converter. To this end, both address bus drivers and the address bus transmit signals from the microprocessor to the RAM and the memory selector so as to enable the RAM to to be actuated to write microprocessor processed data input signals therein when a signal is transmitted from the first encoder to the RAM via the memory write only control lead. At the same time, the processed data input is transmitted from the microprocessor via the data bus and driver first to the RAM and then from the RAM to the parallel-to-serial-data converter when a data ouput signal is received from the microprocessor via the data I/O control lead to the parallel-to-serial data converter so as to actuate same. The converter upon receiving a generator control signal from the master microprocessor then functions to progressively convert each processed parallel 8-bit data word of a 32-bit parallel input into serial format as a 32-bit serial data output of the adaptor for use by a serial data processor. It is noted here that the I/O control lead of the master microprocessor in conjunction with the encoded signals of the address bus timely controls the operation of the processed data output from the master microprocessor to the RAM and the parallel-to-serial-data convertor so that none of the processed data will be lost but will be effectively converted to a serial data output that is fully compatible with a serial data processor. At the same time, in order that the data bus driver will transmit a processed data output to the data bus the master microprocessor with its interrupt and read control leads appropriately controls the output of the second NAND gate to the data bus driver.

One of the reasons for the RAM is to temporarily store each processed 8-bit parallel data word of a 32-bit parallel input from the microprocessor until the converter can handle each 8-bit parallel data word. In other words, the baud rate of the data generator of the converter is normally at a slower rate than the baud rate of any parallel data input received by the adaptor. Hence, the microprocessor, after storing the processed 32-bit parallel input in the RAM then receives a fourth series of stored signals from the ROM, the data bus and the data driver, to read the previously stored processed data input in the RAM and transfer same to the parallel-to-serial-data converter so as to assure conversion of all the processed parallel data input into serial format by the converter without any loss thereof.

After a processed parallel data input of the adaptor is converted into a serial data stream output, the adaptor master processor resets itself and awaits another 32-bit parallel data input from either the latch array associated with the master processor or from the slave processor itself.

Assuming that a 32-bit parallel data input is received by the slave data processor, it is first latched-in and then selectively latched-out and transferred in 8-bit parallel word fashion via the slave data bus and slave data driver to the slave microprocessor. Then the slave microprocessor functions to receive instructions from the ROM. As the result of these instructions the microprocessor then functions to act on the stored data input and process same in a desired manner prior to serial conversion. After this processing the slave microprocessor in conjunction with its first encoder, the address bus, the RAM, the ROM, and the master/slave interface all cooperate to effect transfer of the slave processed data from the slave processor to the master processor and the microprocessor thereof for ultimate conversion of the slave processed data into a serial format output by the parallel-to-serial-data converter.

In the event that the master processor is processing a parallel data input at the time of attempted transfer of the slave processed parallel data input, a signal from the data I/O control bus of the first encoder of the master processor to the master/slave interface means prevents transfer of the processed slave parallel data input to the master microprocessor until the master microprocessor is finished with processing a parallel data input. Hence, when the master microprocessor is busy with a parallel data input, the slave data processor can temporarily store any processed parallel slave data input in its RAM thereby preventing loss of the processed slave data input. Thus it is evident that the adaptor, despite master and slave data inputs, continuously operates without loss of an input even if the master microprocessor is busy with a data input when the slave processor attempts to transfer a processed parallel slave data input.

Other objects, advantages, and novel features of the present invention will become more apparent from the following detailed description when taken in conjunction with the appended claims and attached drawings.

DETAILED DESCRIPTION OF THE INVENTION

Figure 1:
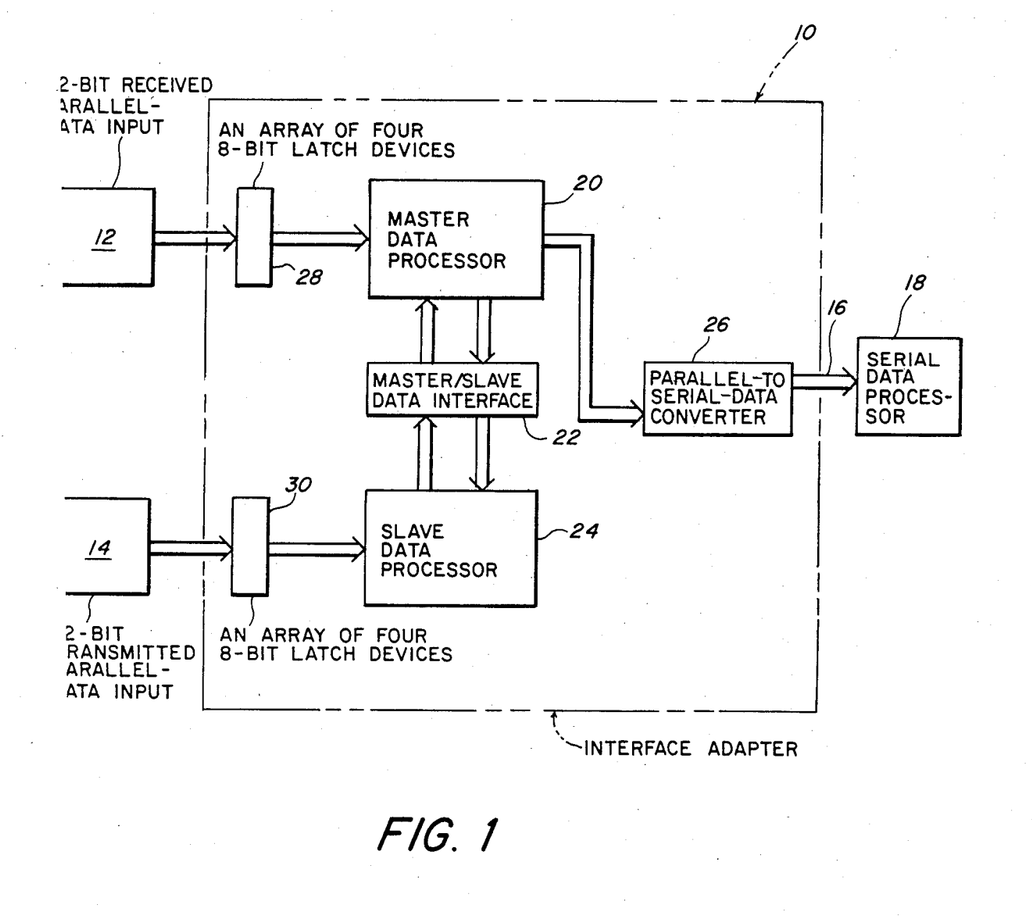
FIG. 1 is a diagrammatic view of a preferred embodiment of an improved interface adaptor of the invention for selectively processing and converting two parallel data inputs into a serial data stream output for a serial data processor.

With further reference to FIG. 1 an improved 32-bit parallel-to-serial-data interface-adaptor 10 is advantageously provided with at least two 32-bit parallel-data inputs 12 and 14 that are selectively processed and converted by the adaptor into a serial data stream output 16 that is compatible with a serial data processor 18. Adaptor 10 is generally made up of a master data processor 20, a master/slave data interface 22, a slave/data processor 24, and a parallel-to-serial-data converter 26. Separate master and slave arrays 28 and 30, each being comprised of four 8-bit latch devices are provided for initially receiving a parallel data input to processors 20 and 24, respectively.

Figure 2:
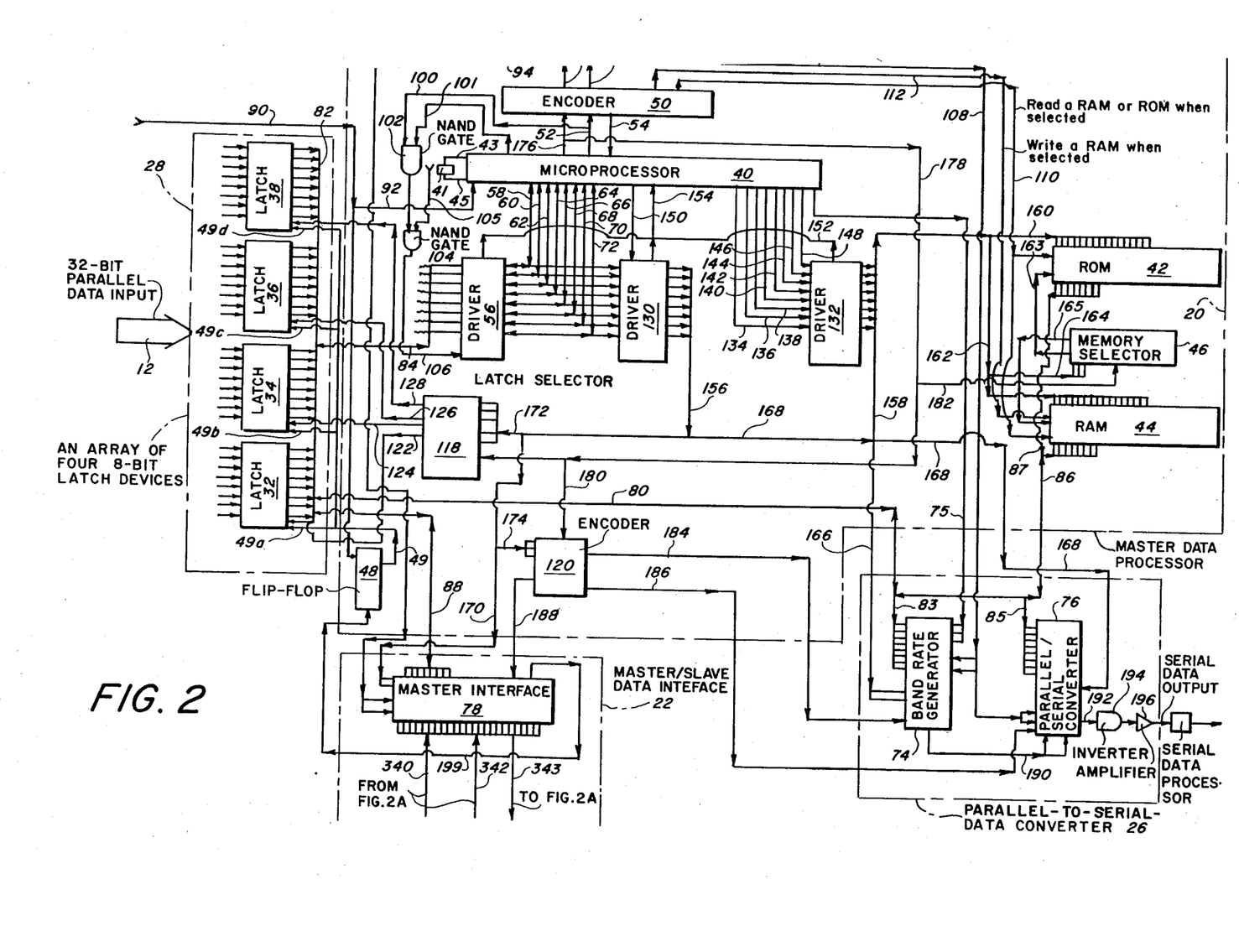
FIGS. 2 and 2A are schematic views when taken together that illustrate in detail various components of the adaptor of FIG. 1 and further illustrate in detail the interrelationship therebetween.

As further illustrated in FIG. 2, array 28 is generally comprised of a series of four 8-bit latch devices 32, 34, 36 and 38. Master data processor 20 is generally made up of a microprocessor 40, a read only memory (ROM) 42, a random access memory (RAM) 44, a memory selector 46 and a flip-flop 48. Processor 40 is provided with a crystal 41 and leads 43 and 45 to complete its oscillator circuit. Flip-flop 48 is provided with an output 49 having a plurality of four branches 49a to d with each branch connected to its associated latch device 32, 34, 36 or 38. A first encoder 50 is connected to a read control lead 52 of processor 40 and also a write control lead 54 thereof. A 8-bit parallel-data input/output (I/O) bus driver 56 is operatively associated with processor 40. To this end a series of eight input/output (I/O) leads 58, 60, 62, 64, 66, 68, 70 and 72 interconnect certain pins of the processor to driver 56. Parallel-to-serial-data converter 26 is provided with a baud-rate generator 74 and a parallel/serial data converter 76. A generator output control lead 75 of processor 40 is parallel connected to three inputs of generator 74. Interface 22 is provided with a master interface 78.

An 8-bit data input/output (I/O) bus 80 includes interconnected branch portions 82, 83, 84, 85, 86, 87 and 88. Data bus portion 82 is parallel connected to each latch device 32, 34, 36 or 38. Data bus portion 84 is directly connected to driver 56; and data bus portions 87, 86, 83 and 85 are parallel interconnected to ROM 42, RAM 44, generator 74 and converter 76 respectively. Data bus portion 88 is connected to master interface 78. A master command signal input lead 90 including its branch lead 92 is parallel connected to flip-flop 48 and processor 40 respectively. A data input/output (I/O) control bus 94 is connected to a pair of output leads 96 and 98 of encoder 50 and to master interface 78. Data I/O control bus 94 is also parallel connected to generator 74 and converter 76. A branch lead 100 of read control lead 52 of processor 40 is connected to an input of a first NAND gate 102. An interrupt lead 101 of processor 40 is also connected to another input of NAND gate 102. The output of NAND gate 102 is connected to an input of a second NAND gate 104. A source of positive bias (not shown) and of preselected value is connected by another lead 105 to another input of gate 104. Output 106 of gate 104 is connected to driver 56. A read only memory control lead 110 is connected to an output of encoder 50 is parallel connected to ROM 42 and RAM 44. A write only memory control lead 112 is connected to another output of encoder 50 and to RAM 44.

Master processor 20 is also provided with a latch selector 118 and a second encoder 120 for selectively controlling certain elements or components of master processor 20. Selector 118 has a series of four output leads 122, 124, 126, and 128. As evident from FIG. 2, each lead 122, 124, 126 or 128 is individually connected to its associated latch device 32, 34, 36 or 38. Processor 40 is provided with a pair of parallel 8-bit address bus drivers 130 and 132. Address driver 130 is provided with a series of eight inputs with each input of the series being connected to its associated I/O lead 58, 60, 62, 64, 66, 68, 70 or 72 of the series of eight I/O leads. Address driver 132 is connected to processor 40 by a series of eight input leads 134, 136, 138, 140, 142, 144, 146 and 148. An output control lead 150 of processor 40 is connected to driver 130. Drivers 56, 130 and 132 are all parallel interconnected via a common feedback lead 152 to a processor input lead 154. By reason of drivers 130 and 132 both being 8-bit address bus drivers, all 8-bit output leads of both drivers 130 and 132 are directly connected to address bus portions 156 and 158 that are parallel interconnected via address bus portions 168, 160 and 162 to ROM 42 and RAM 44 respectively thereby forming a 16-bit address bus connection to ROM 42 and RAM 44. On the other hand, only a series of three address bus leads that are generally indicated at 164 form part of and are interconnected to a series of three interconnected leads of the interconnected address bus portions 156, 168, 158, 160, 162 and 164 thereby interconnecting processor 40 and address driver 130 to memory selector 46. Similarly, a series of two leads of address bus portion 166 is connected to generator 74. Only a single lead of address bus portion 168 is connected to converter 76. Then the interconnected leads of address bus portions 156, 168, and 166; and 156 and 168 interconnect processor 40 and driver 130 to generator 74 and converter 76 respectively. Also, a series of five leads of address bus portion 172 is connected to latch selector 118; a series of three leads of address bus portion 174 is connected to second encoder 120; and a series of two leads of address bus portion 170 is connected to master interface 78. Then, address bus portions 172, 168 and 156; 174, 170, 168 and 156; and 170, 168 and 156 respectively interconnect latch selector 118, second encoder 120 and master interface 78 to driver 130 and processor 40.

Outputs 163 and 165 memory selector 46 are connected to ROM 42 and RAM 44 respectively. An input/output (I/O) control lead 176 of processor 40 is directly connected to encoder 50 and is further parallel connected via branch leads 178, 180 and 182 to latch selector 118, encoder 120 and memory selector 46 respectively. A series of three output leads 184, 186 and 188 of encoder 120 are respectively connected to generator 74, converter 76, and interface 78 respectively. An output lead 190 of generator 72 is parallel connected to a pair of inputs of converter 76. A serial data stream output 192 of converter 76 is series interconnected to an inverter 194, and amplifier 196, and a serial data processor 198. A reset output lead 199 of master interface 78 is connected to flip-flop 48.

Figure 2A:
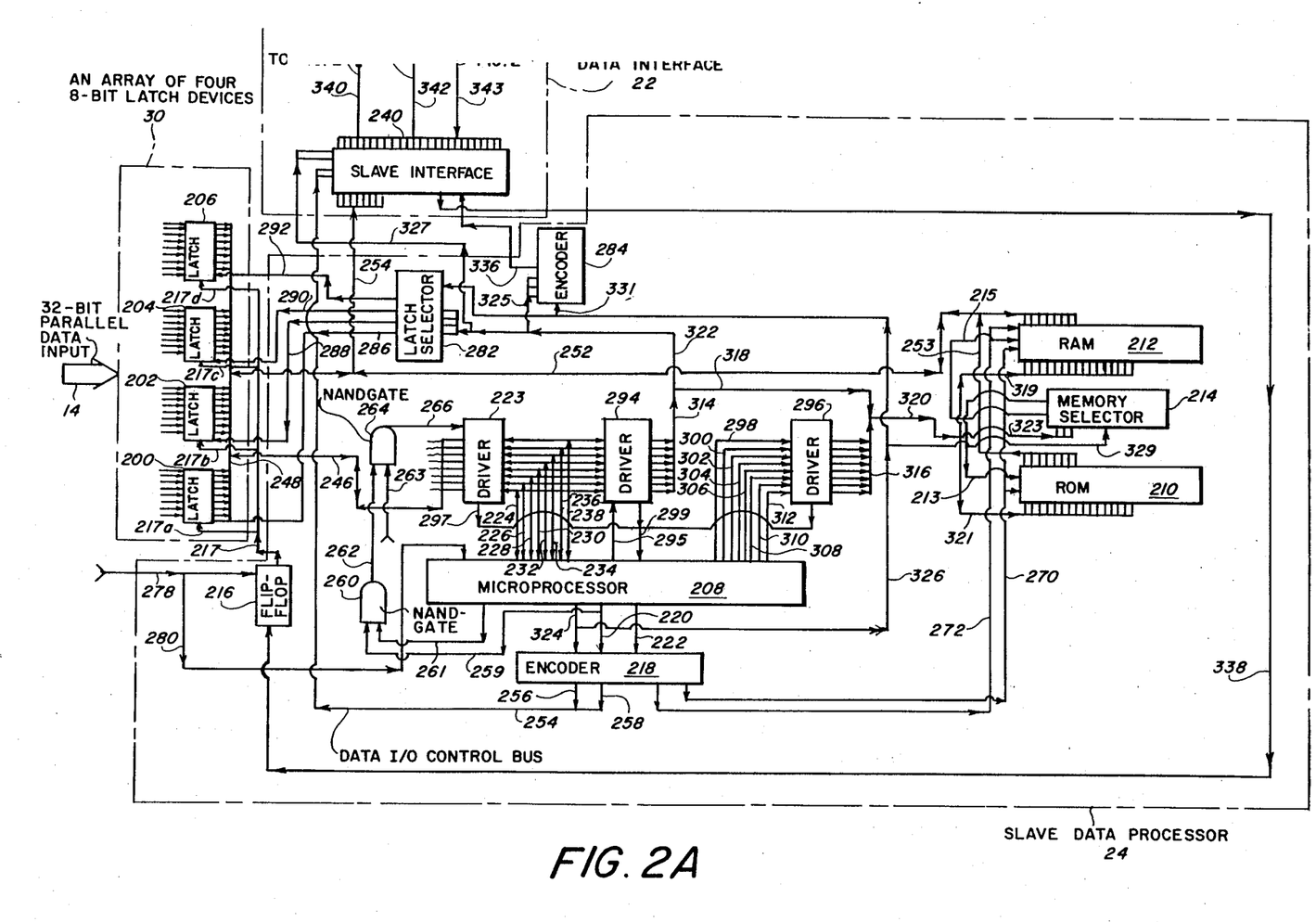

With reference to FIG. 2A, latch device array 30 is generally made up of a series of four 8-bit latch devices 200, 202, 204 and 206. Slave processor 24 is generally comprised of a microprocessor 208, a ROM 210, a RAM 212, a memory selector 214, a flip-flop 216 and a first encoder 218. An output 217 of flip-flop 216 is provided with a plurality of four branch leads 217a to d where each branch lead is separately and parallel connected to its associated latch device 200, 202, 204 or 206. Selector 214 has an output 213 connected to ROM 210 and another output 215 connected to RAM 212. As with processor 40, processor 208 is provided with a crystal, etc. (not shown) to complete its oscillator circuit. Encoder 218 is connected to a read control lead output 220 of processor 208 and is also connected to write control lead output 222 thereof. An 8-bit parallel data input/output (I/O) bus driver 223 is connected to processor 208 by a series of eight input/output (I/O) leads 224, 226, 228, 230, 232, 234, 236, and 238. Interface 22 is also provided with a slave interface 240. As input/output (I/O) data bus is parallel interconnected via its bus portions 246 and 248 to driver 223 and latch devices 200, 202, 204 and 206; parallel interconnected via its bus portions 246, 248, 252 and 254 to driver 223 and interface 240; bus portions 246, 248 and 252 to driver 223 and ROM 210; and bus portions 246, 248, 252 and 253 to driver 223 and RAM 212. A data output control bus 254 is parallel connected to a pair of output leads 256 and 258 of encoder 218 and to a pair of input leads of slave interface 240. A branch lead 259 of read control lead 220 of processor 208 is connected to an input of a first NAND gate 250. An interrupt lead 261 of processor 208 is connected to another input of gate 260. An output 262 of gate 260 is connected to an input of a second NAND gate 264. A source (not shown) of positive bias and of preselected value is connected by another input lead 263 to gate 264. An output 266 of gate 264 is connected to data bus driver 223. A memory read only control lead 270 is connected to an output lead of encoder 218 and is parallel connected to ROM 210 and RAM 212. A memory write only control lead 272 is series connected to an output lead of encoder 218 and RAM 212. A slave command signal input 278 is connected to flip-flop 216 and its branch lead 280 is connected to processor 208.

Slave processor 24 is also provided with a latch selector 282 and a second encoder 284 for selectively controlling a certain element or component thereof. Each output 286, 288, 290 or 292 of a series of four outputs 286, 288, 290 and 292 of selector 282 is respectively connected to its associated latch device 200, 202, 204 or 206 respectively. Processor 208 is provided with a pair of 8-bit address bus drivers 294 and 296. Address bus driver 294 is provided with a series of eight address input leads where each input lead is connected to its associated data I/O lead of the series of eight data I/O leads 224, 226, 228, 230, 232, 234, 236 and 238. Similarly, a series of eight address input leads 298, 300, 302, 304, 306, 308, 310 and 312 from processor 208 are connected to address driver 296. Address driver 294 is connected to an output lead 295 of processor 208. Drivers 223, 294 and 206 are parallel interconnected by a common feedback lead 297 which in turn is connected to an input 299 to processor 208. Eight-bit address bus portions 314 and 316 are directly connected to drivers 294 and 296 respectively. These bus portions are also interconnected by address bus portions 318, 320, and 319; and 318, 320 and 321 so as to form a 16-bit address bus to RAM 212 and ROM 210 respectively. A series of three leads of address bus portion 323 are connected to memory selector 214 and are further interconnected to address bus portions 320, 318 and 314 thereby interconnecting driver 294 and processor 208 to selector 214. Similarly, a series of five leads of address bus portion 322 are connected to latch selector 282; a series of three leads of address bus portion 325 are connected to encoder 284; and a series of two leads of address bus portion 327 are connected to slave interface 240. As the result of address bus portions 322, 325 and 327 all being interconnected to bus portion 314; selector 282, encoder 284 and slave interface 240 are interconnected to processor 208 and driver 294. As with the aforedescribed address bus portions of either processor 20 or 24, the particular manner in which certain leads of master or slave address bus portions are connected to memory selector 46 or 214, latch selector 118 or 282, encoder 120 or 284 and interface 78 or 240 is believed to be within the skills of an adaptor designer and a programmer associated therewith.

Processor 208 has an input/output (I/O) control lead 324 connected to encoder 218, a branch lead 326 connected to latch selector 282, a branch lead 329 connected to memory selector 214, and a branch lead 321 connected to encoder 284. Encoder 284 has an output 336 connected to interface 240. Interface 240 has an output 338 connected to flip-flop 216. Each one of a pair of eight-bit buses 340 and 342 transmits a slave data output that represents the slave processor processed parallel data input from slave interface 240 to master interface 78. One of the reasons for the pair of buses 340 and 342 is that one bus indicates the slave data output is coming to master interface 78 while the other bus effects transfer of the slave data output from interface 240 to interface 78. An other 8-bit bus 343 transmits a master data output from master interface 78 to slave interface 240 and serves to indicate to the slave interface that master processor 20 is busy processing a data input.

Figure 3:
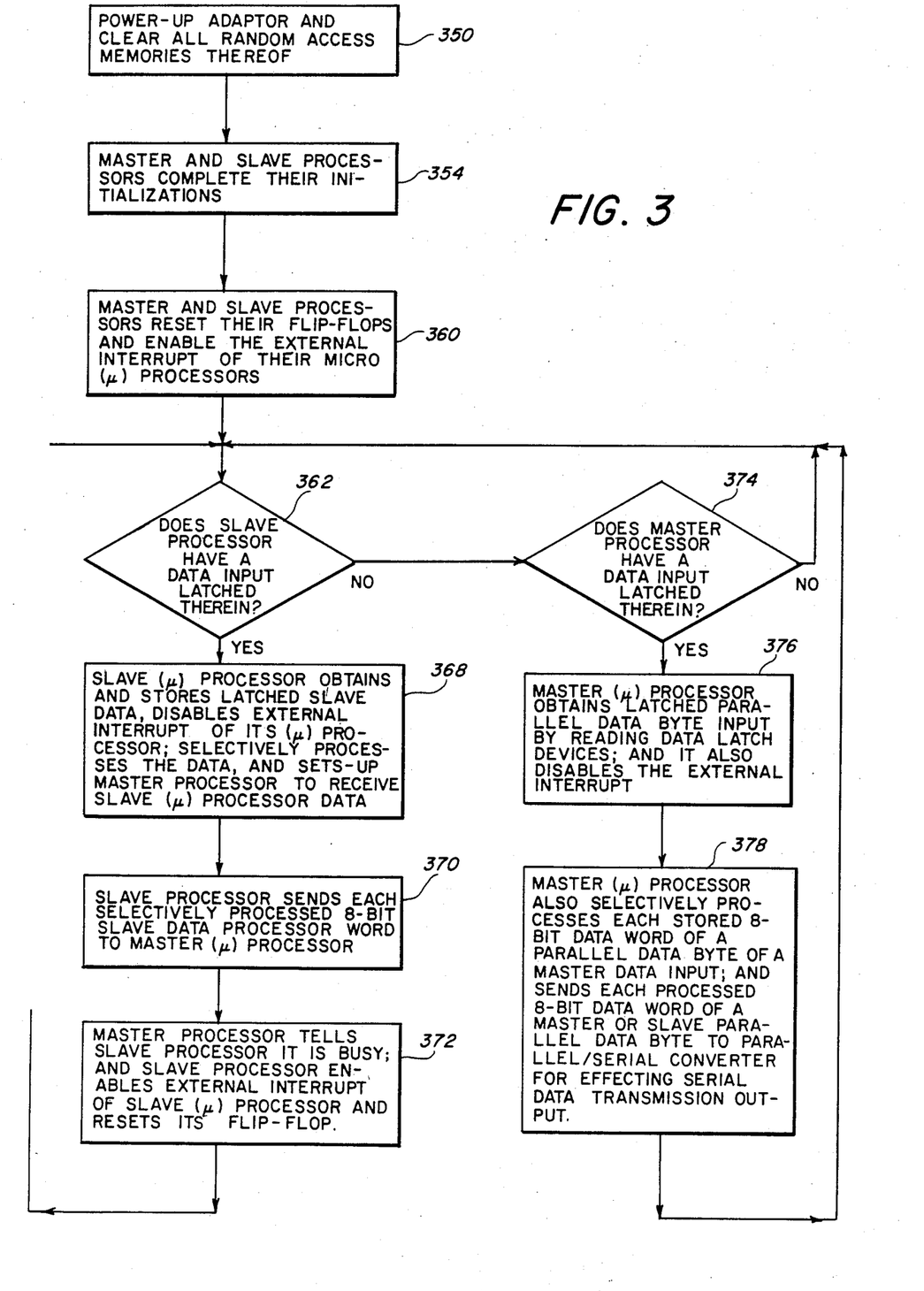
FIG. 3 illustrates a flow chart and an operative embodiment of the adaptor.

An operative embodiment of improved adaptor 10 of FIG. 1 will now be set forth. With reference to FIG. 3, program element 350 indicates that adaptor 10 with its processors 20 and 24 is powered-up by appropriate power supply means (not shown). As the result of adaptor 10 being powered up, master and slave processors 20 and 24, including components thereof, complete their initializations as indicated by block 354. With both processors initialized, microprocessor 40, via its I/O control lead 176, causes the pair of outputs 96 and 98 of encoder 50 to transmit encoded signals via data bus 94 to master interface 78. As the result of these signals to master interface 78, it transmits an output via lead 199 for resetting flip-flop 48 as indicated by block 360. At the same time, read and interrupt outputs 52 and 101 go low so that gate 102 provides a high output. As the result of gate 104 having a positive biased input 105, gate 104 provides a low output 106 that causes driver 56 to be set for receiving an 8-bit parallel word data input and transmitting same to processor 40 through the series of eight I/O output leads 58 to 72. Also a pin of processor 40 that is connected to branch lead 92 is enabled so as to receive a command signal when a data input 12 is received as further indicated by block 360.

In similar fashion after slave processor is initialized it directs a signal via I/O control lead 324 to encoder 218. The encoder then transmits encoded signals via its pair of outputs 256 and 258 to data I/O control bus 254 to slave interface 240 that results in the interface providing an output signal via lead 338 to reset flip-flop 216 so as to be ready to control a 32-bit parallel data input when it is received by slave latch array 30 as further indicated by block 360. At the same time read control lead 220 of processor 208 goes low and such is communicated by branch lead 259 to an input of gate 260. Interrupt lead 261 of processor 208 is also low and provides such an input to gate 260. With both inputs of gate 260 low, its output 262 is high. With high output 262 and positive bias input 263, output 266 of gate 264 is low thereby setting 8-bit parallel bar driver 223 to receive a data input for transmission to processor 208 via eight I/O leads 224 to 238. Similarly, a pin of processor 208 is enabled that is connected to branch lead 280 so as to receive a command signal when a data input 14 is received.

Figure 4:
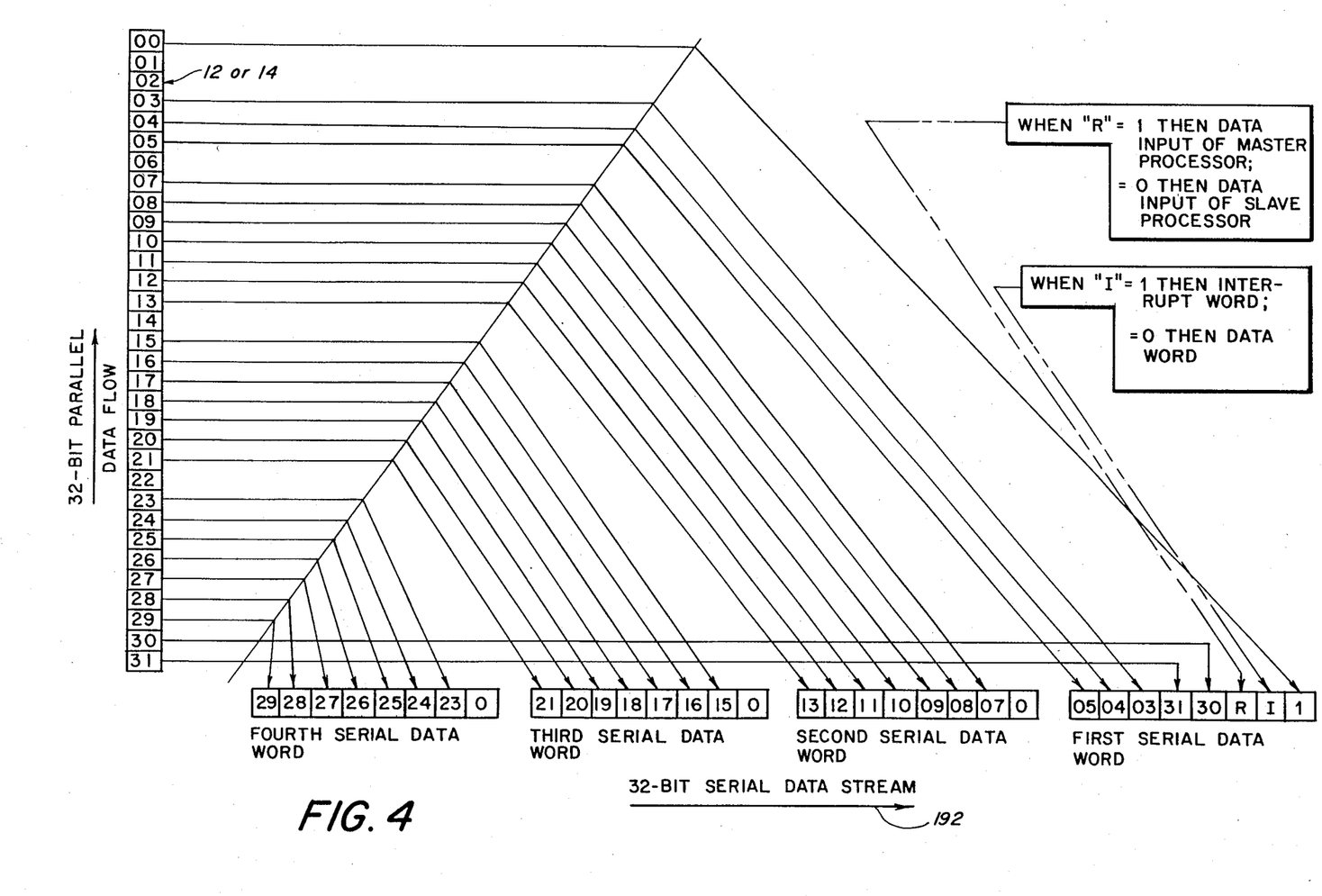
FIG. 4 is a diagrammatic view that represents an example of the profile of a parallel multibit input as received by the adaptor of the invention and that further represents an example of the parallel input with various bit locations thereof being selectively reconfigured and encoded by the adaptor as it is converted from a parallel bit profile input to a serial bit profile output.

When a 32-bit parallel data input 14 is received by slave latch array 30, each 8-bit parallel data word of the 32-bit input is latched in its associated latch device 200, 202, 204 or 206 as the result of a command signal (at the same time as a slave data input 14) via lead 278 actuates flip-flop 216 to provide an output via lead 217 and branch leads 217a to d for latching-in each 8-bit data word of the 32-bit input in a respective latch device 200, 202, 204 or 206 as generally indicated by a decision block 362 in FIG. 4. At the same time, slave command signal branch lead 280 indicates to processor 208 that a data input 14 has been received by latch array 30. Then processor 208 via its series of eight I/O leads 224 and 238 together with its series of eight output leads 298 to 312 provides encoded 16-bit address signals to address a certain stored signal area of ROM 210 via parallel interconnected bus portions 314, 318, 320 and 321; and 316, 320 and 321. At the same time, the I/O control lead 324 of processor 208 goes high so that selector 214 is enabled through branch leads 326 and 329. Then the encoded signals of a series of three leads of interconnected bus portions 314, 318, 320 and 323 actuate selector 214 to provide an output 213 to enable ROM 210 to be actuated to read its addressed certain area of stored instruction signals when a read control signal is received. Processor 208 then transmits a high signal via its read control output 220 and causes encoder 218 to transmit a high signal via its lead 270 thereby actuating ROM 210 to read its addressed certain area of stored instruction signals and transfer them as a first series of stored signals by way of data bus portions 253, 252, 248 and 246, driver 223, I/O leads 224 to 238 to processor 208. Processor 208 in receiving these instruction signals then directs a series of five signals via certain I/O leads of the series of eight I/O leads, driver 294, and a series of five leads of interconnected address bus portions 314 and 322 to latch selector 282. Prior to latch selector 282 being activated, it is first enabled by processor transmitting a signal via I/O control leads 324 and 326 to selector 282. As the result of these series of five signals, activated latch selector 282 via its series of outputs 286, 288, 290 and 292 selectively extracts an 8-bit data input word from each latch device 200, 202, 204 or 206 and transfers same by way of data bus portions 248 and 246, driver 223 and the series of eight I/O leads 224 and 238 to be stored in its associated registry of processor 208, as indicated by block 368. In other words, all 8-bit data latched words are progressively transferred in sequence from their latch devices 200, 202, 204 and 206 to processor 208 so that all 8-bit data words of a 32-bit data input 14 are temporarily stored in processor 208. Once a 32-bit data input 14 is stored in processor 208, processor external interrupt 261 is disabled so that gate output 266 goes high and data bus driver 223 is set so as not to transmit a data input to processor 208 but to transmit a processed 32-bit data output from processor 208 to processor 40 as will be further explained hereinafter. At the same time a pin of processor 208 that is connected to branch lead 280 is disabled so no command signal of another data input 14 will be received by array 30 until processor 208 is finished processing its presently stored input.

Then processor 208 via I/O leads 224 to 238, driver 294, and address bus portions 314 and 318 together with output leads 298 to 312, driver 296 and bus portion 316 transmits a 16-bit address signal via bus portions 320 and 321 to ROM 210 to address stored signals therein for effecting selective processing of the 32-bit data stored in processor 208. For ROM 210 to transmit these instructions I/O control lead 324, 326 and 329 enables selector 213 so as to provide an output 213 to enable ROM 210 to be actuated when the selector is addressed by bus portions 314, 318, 320 and 323, driver 294 and processor 208. Once ROM 210, after actuation by read control lead 270, transmits these instructions as a second series of stored signals via bus portions 253, 252, 248 and 246; driver 223 and I/O leads 224 to 238 to processor 208 then the processor functions to selectively process the stored 32-bit data input prior to transferring the stored input to master processor 20.

With reference to FIG. 4 a 32-parallel data byte input 12 or 14 is depicted in columnar fashion with the bits designated 00 to 31. In order for the parallel byte to be compatible with a serial data processor, adaptor 10 not only transforms the 32-bit parallel byte input 12 or 14 into a serial data stream or output 192 made up of four eight-bit data words but also reconfigures various bit locations of the 32-bit input as well as reencodes various bit locations thereof. As evident from FIG. 4, the first bit locations of each serial word correspond to parallel bit locations 00, 06, 14 and 22 respectively and also have predetermined binary code values assigned thereto. On the other hand, second bit location of the first serial word of stream 197 which corresponds to second bit location "01" of parallel input 12 or 14 will either be binary encoded "1" or "1" depending on whether the parallel input 12 or 14 is in fact an interrupt word or in fact a 32-bit parallel byte data word. Similarly the third bit location of the first serial word which corresponds to third bit location "02" of parallel input 12 or 14 will either be binary encoded "1" or "0" depending on whether a parallel input is in fact a master input 12 or a slave input 14. Also, parallel bit locations "30" and "31" of input 12 or 14 are reconfigured to bit locations three and four of the first serial word. The remaining bit locations "03" to "05", "07" to "13", "15" to "21" and "23" to "29" of parallel input 12 or 14 are reconfigured to their associated bit locations of a respective serial word of the series of four words that form stream 192 in the manner shown by the arrowed lines in FIG. 4. Thus, depending upon the requirements of a serial data processor, a 32-bit parallel input can readily be processed and reconfigured by adaptor 10 into any desired serial format. In other words, ROM 42 or 210 can be appropriately programmed for directing microprocessor 40 or 208 for processing a parallel byte input, such as reencoding and reconfiguring thereof, into any desired serial data output configuration.

With the stored 32-bit data input processed by processor 208 as indicated by block 368, the processor addresses the ROM and selector via drivers 294 and 296 as aforedescribed as well as actuates the ROM via read control lead 270 to read the addressed stored signal thereof for the next instruction to the processor. When the processor receives the next instruction or third series of signals from ROM 210 via data bus portions 253, 252, 248 and 246, driver 223, etc., processor 208 transmits an output by lead 324 to encoder 218. The encoder then sends output signals by leads 256 and 258 and data output control bus 254 to slave interface 240 to set up interface 240 for effecting transfer of the stored/processed 32-bit data input of processor 208.

After setting up interface 240, processor 208, in further response to the third series of instruction signals from ROM 210, addresses RAM 212 and selector 214 such that output 215 of the addressed selector initiates the RAM to be actuated to write for the purpose of temporarily storing the 32-bit processed data of processor 208 when a write control signal is received by RAM 212 from processor encoder 218 and its lead 272 as the result of a signal by processor 208 through write control lead 222. After all the 32-bit data is temporarily stored in the RAM, processor 208 further functions in response to an instruction from ROM 210 to address the RAM and selector 214 so as to read the temporarily stored 32-bit data for transfer by data bus portions 252 and 254 to interface 240. As each 8-bit parallel data word of a 32-bit parallel data input is being read from RAM 212 and transferred via bus portions 252 and 254 to slave interface 240, processor 208 by a series of two I/O leads of eight I/O leads 224 to 238, driver 294 and a series of two leads of address bus portions 314, 322 and 327 addresses interface 240 and actuates same to transfer each 8-bit parallel data word from slave interface 240 to master interface 78 by way of 8-bit bus portions 340 and 342. In order for interface 240 to be actuated, processor has previously sent a series of three encoded signals via certain I/O leads 224 to 238, driver 294 and address bus portions 314, 322 and 325 to encoder 284. These signals with the encoder also enabled by an output signal from I/O control leads 324, 326 and 331 as the result of the action of processor 208 causes addressed encoder 284 to provide output with a signal 336 to enable interface 240 for actuation.

Since master interface 78 has been actuated by signals of data I/O control bus 94 to receive each 8-bit parallel data word from processor 208, each 8-bit slave-processed parallel word is transferred from master interface 78 to processor 40 by way of bus portions 88, 82 and 84, driver 56 and I/O leads 58 to 72 until processor 40 receives all 8-bit slave-processed parallel words of a 32-bit parallel slave data input from processor 208. At this time gate output 106 goes high so that driver 56 will not receive a data input but will transmit a processed data output to RAM 44 as will be subsequently described. Further, a pin of processor 40 connected to branch lead 92 is disabled so as not to receive a command signal for another data input 12 until processor 40 is finished with the presently stored processed and transferred slave processor data input 14.

Then processor 40 seeks to obtain a series of instruction signals from ROM 42 by first addressing the ROM and selector 46 by way of I/O leads 58 to 72 and driver 130 together with output leads 134 to 148 and driver 132, as well as bus portions 156, 168, 158, 160, 162 and 164 to ROM 42 and selector 46. The addressed enabled selector provides an output to addressed ROM 42 to be actuated when a read control signal is received. At the same time, processor 40 transmits a signal by its output 52 to encoder 50 and then to read control lead 110 to actuate ROM to send the series of instruction signals to processor 40 by way of bus portions 87, 86, 80, 82 and 84, driver 56 and I/O leads 58 to 72. When the processor receives these instruction signals, it transmits signals by I/O leads 58–72, driver 56 and bus portions 84, 82 and 88 to interface 78. The processor also sends signals by I/O leads 58 to 72, driver 130 and address bus portions 156, 168, 170 and 174 to first actuate encoder 120 to provide output 188 with a signal to enable interface 78 so that it can be actuated. The processor then sends signals by I/O leads 58 to 72, driver 130 and address bus portions 156, 168 and 170 to actuate interface 78 so as to interconnect the signals of bus portion 88 with interface feedback bus 343 for the purpose of advising slave interface 240 that processor 40 is busy with the transferred slave data input as indicated by block 372.

Slave interface 240 then transfers these signals indicating processor 40 is busy by bus portions 254, 252, 248, and 246, etc. to processor 208. Processor 208, upon receiving these signals then addresses ROM 210 for its next series of instruction signals. This series of instruction signals causes the processor to reenable its external interrupt 261 so that the output of gate 264 will reset data bus driver 223 to receive another data input and also to reenable a pin of processor 208 that is connected to branch lead 280 for receiving another command signal with another data input 14. The processor also addresses encoder 284 by a series of three leads of I/O leads 224 to 238, driver 294 and address bus portions 314, 322 and 325. Addressing the encoder causes its output 336 to have a signal for actuating interface 240 after it has been addressed by encoded signals from address bus portions 314, 322 and 327, driver 294, etc., so as to provide a signal in lead 338 to re-reset flip-flop 48 for another 32-bit parallel data input 14 to be received by latch array 30 for slave processor 24 of adaptor 10 as further indicated by block 372.

When processor 40 receives all of the slave data, it then functions to send the data to RAM 44 and then the parallel-to-serial converter 26 for conversion to a serial data format as will become more apparent when master processor 20 processes a master data input 12 as will now be described.

After block 372, the flow chart of FIG. 4 returns to block 362. Assuming no slave data input 14 is received but that a decision block 374 indicates a master data input 12 has been received. To this end, the command signal as received by lead 90 actuates flip-flop 48 to provide outputs 49a to d to latch-in each 8-bit parallel word of the input in its associated latch device 32, 34, 36 or 38. The command signal also received by branch lead 92 advises processor 40 that array 28 has a latched-in data input. Processor 40 then receives a first series of instruction signals from ROM 42 by data bus portions 87, 86, 80, 82 and 84 after the ROM and enabled selector 46 were addressed by address bus portions 156, 168, 158 and 160; 156 168, 158, 160, 162 and 164. The addressed selector provides output 163 with a signal to initiate the ROM to be actuated; and memory read control lead 110, sends a signal to actuate the addressed and initiated ROM. Processor in response to these instructions, first enables selector 118 by a signal through I/O control leads 176 and 178 and then actuates the enabled latch selector by a series of five leads of eight I/O leads 58 to 72, driver 130 and address bus portions 156, 168 and 172.

As result of selector 118 being actuated, each one of the series of four outputs 122, 124, 126 and 128 directs its associated latch device 32, 34, 36 or 38 to transfer each latched 8-bit parallel data word of the 32-bit input to processor 40 by way of data bus portions 82 and 84, driver 56 and eight I/O leads 58 to 72. After the data has been transferred from array 28 to processor 40, and as indicated by block 376 in FIG. 3, the processor disables its interrupt 101 so that the output of gate 104 provides a high signal and driver 56 is set to receive no data input but to transfer a processed data output from processor 40 to RAM 44 as will be subsequently described. At the same time a pin of processor 40 that is connected to branch lead 92 is disabled so that no command signal of another data input 12 will be received until processor 40 is finished with the presently stored data input. Processor also sends a signal via I/O control lead 176, 178 and 180 to enable encoder 120 and then sends a series of three encoded signals via a series of three I/O leads of I/O leads 58 to 72, driver 130 and a series of three leads of address bus portions 156, 168, 170 and 174 so that encoder 120 provides a signal via lead 188 to enable interface 78 for actuation. The processor also sends further encoded signals via address bus portions 156, 168 and 170, etc. to actuate the enabled interface so that it will send encoded signals via feedback bus 343 to indicate to slave inteface 240 that it is busy and no data input is to be transferred from the slave processor to the master processor.

With processor 40 having an input from array 28, it receives a second series of instruction signals from ROM 42 in similar fashion as aforedescribed. This instruction selectively processes each 8-bit parallel stored word of input 14 in a desired manner as aforedescribed in FIG. 4 and as indicated in block 378 of the flow chart of FIG. 3.

After data input 12 is processed by processor 40 it receives a third series of instruction signals from ROM 42. The processor addresses the RAM and selector 46 by way of drivers 130 and 132; and 130 respectively. A signal from output 165 of addressed and enabled selector 46 (enabled by processor 40 via leads 176, 178 and 182) initiates RAM 44 for actuation to write-in a processed data output of a successive series of four 8-bit processed parallel data words as received from processor 40, data bus portions 84, 82, 80 and 86, etc. when a signal is received by the RAM from write control lead 112, encoder 50, etc. Then processor 40 via output 176, encoder 50, a pair of leads 96 and 98 and data I/O control bus 94, it sends data output encoded signal to generator 74 to get set for actuation. Processor 40, through lead 75, transmits a signal to generator 74 so that the generator will provide a baud rate signal via output 190 for causing operation of converter 76 to convert each processed parallel 8-bit word from RAM 44 into an 8-bit serial word format as shown in FIG. 4. At the same time processor 40 provides data word instructions to generator 74 via I/O leads 58 to 72, driver 56 and bus portions 84, 82, 80 and 83. Also, processor 40, in continued response to the series of instruction signals from the ROM, provides a signal via I/O control leads 176, 178 and 180 to enable encoder 120. The enabled encoder after receiving a series of three encoded signals from address bus portions 156, 168, 170 and 174 provides a signal via output 184 to enable the data instructed generator for actuation when addressed. Accordingly, generator 74 then receives a series of two encoded signals from address bus portions 156, 168 and 166 which actuates the generator to provide a signal via output 190 causing operation of converter 76 when it is enabled and addressed and RAM stored/processed data words are transmitted thereto.

To this end processor 40 further functions to send a read signal by control lead 110 and readdress the RAM and selector 46, etc. so that the stored processed data input of the actuated/addressed RAM 44 is now read and transferred as a data output from the RAM to converter 76. At the same time processor 40 addresses converter 76 via a connecting lead of address bus portions 168, interconnecting lead of address bus portions 156, etc. along with an output encoded signals of control bus 94 and processor-controlled enabled output signal of lead 186 thereby resulting in generator-driven, addressed and enabled converter 76 to convert each 8-bit parallel word from the RAM via bus portions 86 and 85 into a serial word output 192.

After the converter provides a serial output of a parallel input, processor 40 receives another series of instruction signals from ROM 42 and then addresses encoder 120 by its driver 130, etc. so that the encoder provides an output signal by lead 188 to enable interface 78. At the same time processor 40 addresses interface 78 with a series of encoded signals via address bus portions 156, 168 and 170, etc. so that the enabled/actuated interface provides an output signal to lead 199 for re-resetting flip-flop 48 prior to another data input 12 being received by latch array 28.

As evident from FIGS. 2 and 2A adaptor 10 when it receives an input at either input 12 or 14 or at both inputs, the master processor by reason of interface 22 functions to process only one input at a time even though an input is temporarily latched in an input array 28 or 30 or is temporarily stored in slave RAM 212. Hence, adapter 10 provides continuous operation in selectively handling master and slave parallel data inputs so as to provide a serial data output for each parallel data input without loss thereof.

Obviously, many modifications and variations of the present invention are possible in light of the above teachings. It is therefore to be understood that within the scope of the appended claims, the invention may be practiced than as otherwise described.

What is claimed is:

1. A data interface adaptor for receiving a parallel data input and for selectively processing the received data input prior to converting the processed parallel data input into a serial data output for use by a serial data processor, said adaptor comprising:
   multibit latch means for receiving a parallel data input,
   flip-flop means connected to the latch means for latching a received parallel data input when the flip-flop means is actuated,
   processor means,
   command signal input means connected to the flip-flop means for actuating same and to the processor means for indicating when a command signal is received by the command signal input means as a parallel data input is received in the latch means,
   read only memory (ROM) means,
   parallel-to-serial-data converter-means,
   data input/output (I/O) bus means, the bus means being interconnected to the latch means, the ROM means, and the parallel-to-serial-data converter-means, and
   address bus means, the address bus means being interconnected to the latch means, the processor means, the ROM means, and the parallel-to-serial-data converter-means,
   the processor means for addressing the ROM means via the address bus means so as to read a series of stored program signals therein and cause transfer of the stored program signals from the ROM to the processor means when a command signal is received by the command signal input means as a parallel data input is received by the latching means, the series of stored program signals when received by the processor means causing the processor means to address the latch means via the address bus means and to effect transfer of the latched-in parallel data input from the latching means to the processor means via the data I/O bus means, the processor means after receiving the parallel-data input addressing the ROM means via the address bus means so as to read a second series of stored program signals therein and cause transfer of the stored program signals from the ROM to the processor means via the data I/O bus means, the second series of stored program signals when received by the processor means causing the processor means to selectively process the stored parallel-data input prior to converting the processed/stored parallel-data input into serial format, the processor means after selectively processing the stored parallel-data input addressing the ROM means via the address bus means so as to read a third series of stored program signals therein and cause transfer of the third series of stored program signals therein from the ROM means to the processor means via the data I/O bus means, the processor means upon receiving the third series of stored program signals causing the processor means to address the parallel-to-serial-data converter-means via the address bus means while at the same time to cause transfer of the processed/stored parallel-data input from the processor means to the parallel-to-serial-data converter means via the data I/O means so as to effect conversion of the processed parallel-data input into a serial data stream output.

2. A data interface adaptor as set forth in claim 1 wherein the latch means is comprised of a series of two or more latch means and wherein each latch means of the series is capable of receiving an eight-bit parallel data word.

3. A data interface adaptor as set forth in claim 1 wherein the second series of stored program signals causes the processor means in selectively processing the stored parallel data-input to redesignate and/or rearrange certain bit locations of the stored parallel-data input so that the stored parallel-data input is compatible with a serial data processor when the selectively processed stored parallel-data input is converted to a serial data output.

4. A data interface adaptor as set forth in claim 1 wherein the processor means is microprocessor means.

5. A data interface adaptor as set forth in claim 1 wherein the processor means is provided with separate driver means for the address bus means and the data I/O bus means.

6. A data interface adaptor for receiving a parallel data input and for selectively processing the received data input prior to converting the processed parallel-data input into a serial data output for use by a serial data processor, said adaptor comprising:
   a series of two or more multibit latching means, each latching means of the series for receiving its associated part of a parallel data input, flip-flop means connected to each latching means of the series of latching means, each latching means to latch-in its associated part of a received parallel data input when the latching means is actuated by the flip-flop means, command signal input means connected to the flip-flop means for actuating same and to the processor means for indicating same when a command signal is received by the command signal input means as a parallel data input is received in the latching means, read only memory (ROM) means, parallel-to-serial-data converter-means, the processor means having parallel data driver means connected thereto, data input/output (I/O) bus means, the bus means being interconnected to the latching means, the driver means, the ROM means, and the parallel-to-serial-data converter-means, latch selector means connected to each one of the latching means of the series thereof, address bus means, the address bus means being interconnected to the latch selector means, the processor means, the ROM means and the parallel-to-serial-data converter-means, and the processor means having encoder means connected thereto, the encoder means also having memory read control lead means connected to the ROM means, the processor means for addressing the ROM means via the address bus means upon the encoder means transmitting a signal to the ROM means via the memory read control lead means so as to read a series of stored program signals therein and cuase transfer of the series of stored program signals from the ROM means to the driver means and the processor means when a command signal is received by the command signal input means as a parallel data input is received by the series of two or more latching means, the series of stored program signals when received by the processor means causing the processor means to address the latch selector means via the address bus means so as to effect transfer of the parallel data input from the series of two or more latching means to the driver means and the processor means via the data I/O bus means, the processor means after receiving the parallel data input addressing the ROM means via the address bus means while at the same time the encoder means sends a signal via the memory read control lead means to the ROM means so as to read a second series of stored program signals therein and cause transfer of the stored program signals from the ROM means to the processor means via the data I/O bus means, the second series of stored program signals when received by the processor means causing the processor means to selectively process the stored parallel data input prior to converting the processed/stored parallel data input into serial format, the processor means after selectively processing the stored parallel data input addressing the ROM means via the address bus means upon the encoder means transmitting a signal to the ROM means via the memory read control lead means so as to read a third series of stored program signals therein and cause transfer of the third series of stored program signals therein from the ROM means to the processor means via the data I/O bus means, the processor means upon receiving the third series of stored program signals address the parallel-to-serial-data converter-means via the address bus means while at the same time to cause transfer of the processed/stored parallel-data input from the processor means to the parallel-to-serial-data converter means via the data I/O bus means so as to effect conversion of the processed parallel data input into a serial data stream output.

7. An interface adaptor as set forth in claim 6 wherein the encoder means is provided with data I/O control bus means connected to the parallel-to-serial-data converter means, the encoder means for transmitting a signal via the data I/O control bus means to the parallel-to-serial-data converter-means for controlling its operation during adaptor use.

8. A data interface adaptor as set forth in claim 6 wherein each latching means of the series of two-or-more latching means is adapted to simultaneously receive eight-bits of a parallel multibit data input.

9. A data interface adaptor for receiving a parallel data input and for selectively processing the received data input prior to converting the processed parallel data input into a serial data output for use by a serial data processor, said adaptor comprising:

a series of two or more multibit latching means, each latching means of the series for receiving its associated part of a parallel data input.

flip-flop means connected to each latching means of the series of latching means, each latching means to latch-in its associated part of a received parallel data input when the latching means is actuated by the flip-flop means, command signal input means connected to the flip-flop means for actuating same and to the processor means for indicating when a command signal is received by the command signal input means as a parallel data input is received in the latching means, random access memory (RAM) means, read only memory (ROM) means, parallel-to-serial-data converter-means, the processor means having a parallel data driver means connected thereto, data input/output (I/O) bus means, the bus means being interconnected to the latching means, the driver means, the RAM means, the ROM means, and the parallel-to-serial-data converter-means, latch selector means connected to each one of the latching means of the series thereof, memory selector means having separate output means connected to the RAM means and the ROM means;

address bus means, the address bus means being interconnected to the latch selector means, the processor means, the RAM means, the ROM means, the memory selector means and the parallel-to-serial-data converter-means, and the processor means having encoder means connected thereto, the encoder means having memory read control lead means connected to the ROM means and also having memory write control lead means connected to the RAM means, the processor means for addressing via the address bus means both the memory selector means and the ROM means so that the memory selector means as addressed provides through its output means an output to actuate the ROM means to read a series of stored program signals therein when the encoder means sends a signal over the memory read control lead means to the ROM means so as to cause transfer of the series of stored signals from the ROM means by way of the data I/O bus means to the driver means and the processor means upon a command signal being received by the command signal input means as a parallel data input is received by the latching means, the series of stored signals when received by the processor means causing the processor means to address via the address bus means the latch selector means so that the latch selector means as addressed causes transfer of the latched-in parallel data input from each latching means of the series thereof via the data I/O bus means to the driver means and the processor means, the processor means after receiving the parallel data input addressing via the address bus means both the ROM means and the memory selector means so that the memory selector means as addressed provides an output through its output means to actuate the ROM means to read a second series of stored signals when the encoder means sends a signal by way of its memory read control lead means to the ROM means so as to cause transfer of the second series of stored signals from the ROM means via the data I/O bus means to the driver means and the processor means, the second series of stored signals causing the processor means to selectively process the stored parallel data input prior to converting the processed/stored parallel data input into serial format, the processor means after selectively processing the stored/parallel data input addressing via the address bus means both the ROM means and the memory selector means so that the memory selector means as addressed provides an output through its output means to actuate the ROM means to read a third series of stored signals when the encoder means sends a signal by way of its memory read control lead means to the ROM means so as to cause transfer of the third series of stored signals from the ROM means via the data I/O bus means to the driver means and the processor means; the processor means upon receiving the third series of stored signals addressing the memory selector means, the RAM means and the parallel-to-serial-data converter-means so that the memory selector means as addressed provides an output through its output means to the RAM means to actuate the RAM means to temporarily store a processed parallel data input from the processor means when the encoder means sends a signal via its memory write only control lead means to the RAM means as the processor means sends the processed parallel data input to both the RAM means and the parallel-to-serial-data converter-means via the data I/O bus means so as to effect conversion of the processed parallel data input into a serial data stream output.

10. A data interface adaptor having more than one parallel data input, said adaptor comprising:

master multibit latching means for receiving a parallel data input, slave multibit latching means for receiving another parallel data input, master processor means having the flip-flop means, microprocessor means, and parallel-data driver means, the master microprocessor means being connected to the master parallel-data driver means, slave processor means having flip-flop means, microprocessor means, and parallel-data driver means, the slave microprocessor means being connected to the slave parallel-data driver means, the master and slave flop-flop means being separately connected to their associated master and slave latch means for latching a master or slave parallel data input when the master or slave flip-flop means is actuated, master command signal input means connected to the master flip-flop means for actuating same and to the master microprocessor means for indicating when a master command signal is received by the master command signal input means as a master parallel data input is received in the master latch means, slave command signal input means connected to the slave flip-flop means for actuating same and to the slave microprocessor means for indicating when a slave command signal is received by the slave command signal input means as a slave parallel-data input is received by the slave latch means, interface means for interconnecting the master and slave processor means, master data input/output (I/O) bus means, the master data I/O bus means being interconnected to the master latching means, the master parallel data driver means, and the interface means, slave data input/output (I/O) bus means, the slave data I/O bus means being interconnected to the slave latching means, the slave parallel data driver means, and the interface means, and the master processor means having encoder means and master data input/output (I/O) control bus means, the encoder means being connected to the master microprocessor means, the master data I/O control bus means being connected to the encoder means and the interface means, an output signal of the master data I/O control bus means for controlling the interface means so as to prevent passage of a slave parallel-data input from the slave processor means to the master processor means when a master parallel-data input is received in the master latching means.

11. A data interface adaptor having more than one parallel data input and for selectively processing each received data input prior to converting any processed parallel data input into a serial data output for use by a serial data processor, said adaptor comprising:

master multibit latching means for receiving a parallel data input, slave multibit latching means for receiving another parallel data input, master processor means having flip-flop means, microprocessor means, and parallel data driver means, the master microprocessor means being connected to the master parallel data driver means, slave processor means having flip-flop means, microprocessor means, read only memory (ROM) means, and parallel data driver means, the slave microprocessor means being connected to the slave parallel data driver means, the master and slave flip-flop means being separately connected to their associated master and slave latching means for latching a master or slave parallel data input when the master or slave flop-flop means is actuated, master command signal input means connected to the master flip-flop means for actuating same and to the master microprocessor means for indicating when a master command signal is received by the master command signal input means as a master parallel data input is received in the master latching means, slave command signal input means connected to the slave flip-flop means for actuating same and to the slave microprocessor means for indicating when a slave command signal is received by the slave command signal input means as a slave parallel-data input is received by the slave latch means, interface means for interconnecting the master and slave processor means, master data input/output (I/O) bus means, the master data I/O bus means being interconnected to the master latching means, the master parallel data driver means, and the interface means, slave data input/output (I/O) bus means, the slave data I/O bus means being interconnected to the slave latching means, the slave parallel-data driver means, the slave ROM means, and the interface means, slave address bus means interconnected to the slave microprocessor means, the interface means, slave latching means and the ROM means, and the slave microprocessor means having encoder means, the encoder means having memory read only control lead means connected to the slave ROM means, the slave microprocessor means for addressing its ROM means via its address bus means so as to read a series of stored signals in its ROM means and cause transfer of the series of stored signals from the slave ROM means to the slave microprocessor means via the slave data I/O bus means when a command signal is received by the slave command signal input means as a slave parallel data input is received by the slave latching means, the series of stored signals when received by the slave microprocessor means causing the slave microprocessor means to address latching means via the address bus means and to effect transfer of the latched-in parallel data input from the latching means to the slave microprocessor means via the slave data I/O bus means, the slave microprocessor means after receiving the parallel data input addressing its ROM means via the address bus means so as to read a second series of stored signals therein and cause transfer of the second series of stored signals from the slave ROM means via the slave data I/O bus means to the slave driver means and the slave microprocessor means, the slave microprocessor means after receiving the second series of stored signals selectively processing the stored parallel data input prior to transferring the processed/stored parallel data input to the interface means and the master microprocessor means via the slave and master data I/O bus means before a parallel data input is received by the master latching means.

12. A data interface adaptor having more than one parallel data input and for selectively processing each received data input prior to converting any processed parallel data input into a serial data output for use by a serial data processor, said adaptor comprising:

master multibit latching means for receiving a parallel data input, slave multibit latching means for receiving another parallel data input, master processor means having flip-flop means, microprocessor means and parallel data driver means, the master microprocessor means being connected to the master parallel data driver means, slave processor means having flip-flop means, ROM means, RAM means, memory selector means, microprocessor means, and parallel-data driver means, the slave microprocessor means being connected to the parallel-data driver means, the memory selector means having separate output means connected to the RAM and ROM means, the master and slave flip-flop means being separately connected to their associated master and slave latching means for latching a master or slave parallel data input when the master or slave flip-flop means is actuated, master command signal input means connected to the master flip-flop means for actuating same and to the master microprocessor means for indicating when a master command signal is received by the master command signal input means as a master parallel data input is received in the master latching means, slave command signal input means connected to the slave flip-flop means for actuating same and to the slave microprocessor means for indicating when a slave command signal is received by the slave command signal input means as a slave parallel-data input is received by the slave latching means, interface means for interconnecting the master and slave processor means, master data input/output (I/O) bus means, the master data I/O bus means being interconnected to the master latching means, the master parallel-data driver means and the interface means, slave data input/output (I/)) bus means, the slave data I/O bus means being interconnected to the slave latching means, the slave parallel data driver means, the ROM means, the RAM means, and the interface means, slave address bus means interconnected to the slave microprocessor means, the slave latching means, the slave ROM means, the slave RAM means, the slave memory selector means, and the interface means, and the slave microprocessor means having encoder means, the encoder means having memory read only control lead means connected to the slave RAM means, and also having memory write only control lead means connected to the slave RAM means, the slave microprocessor means for addressing its ROM means and its memory selector means via its address bus means so as to read a series of stored signals in its ROM means upon the memory selector means in being addressed provides an output via its output means to the ROM means to actuate same and cause transfer of the series of stored signals from the slave ROM means to the slave driver means and the slave microprocessor means via the slave data I/O bus means when a command signal is received by the slave command signal input means as a slave parallel data input is received by the slave latching means, the series of stored signals when received by the slave microprocessor means causing the slave microprocessor means to address latching means via the address bus means and to effect transfer of the latched-in parallel data input from the latching means to the slave microprocessor means via the slave data I/O bus means, the slave microprocessor means after receiving the parallel data input addressing its ROM means and memory selector means via the address bus means so as to read a second series of stored signals therein upon the memory selector means in being addressed provides an output via its output means to the ROM means to actuate same and cause transfer of the second series of stored signals from the slave ROM means via the slave data I/O bus means to the slave driver means and the slave microprocessor means, the slave microprocessor means after receiving the second series of stored signals selectively processing the stored parallel data input prior to transferring the processed/stored parallel data input to the interface means and the master microprocessor means, the slave microprocessor means after selectively processing the stored/parallel data input addressing the ROM means and the memory selector means via the address bus means so as to send a third series of stored signals in the slave ROM means upon the memory selector means in being addressed provides an output via its output means to the ROM means to actuate same and cause transfer of the third series of stored signals from the slave ROM means to the slave driver means and the slave microprocessor means via the slave data I/O bus means, the slave microprocessor means after receiving the third series of stored signals simultaneously addressing the RAM means, the memory selector means and the interface means so as to write in the RAM means the processed parallel data input being transferred from the slave microprocessor means via the slave data I/O bus means to the RAM means upon the memory selector means in being addressed provides an output via its output means to the RAM means to actuate same and the processed parallel data input being also simultaneously transferred from the slave microprocessor means via the slave data I/O bus means to the interface means upon the interface means in being addressed effects transfer of the slave processed parallel data input in conjunction with the written slave processed parallel data input of the RAM means to the master microprocessor means via the master data I/O bus means prior to conversion of the transferred slave input into serial format.

* * * * *